(12) United States Patent
Libby

(10) Patent No.: US 11,588,304 B1
(45) Date of Patent: Feb. 21, 2023

(54) ELECTRICAL SUBSTATION YARD WIRING

(71) Applicant: Wunderlich-Malec Engineering, Inc., Eden Prairie, MN (US)

(72) Inventor: Alan A. Libby, Winslow, ME (US)

(73) Assignee: WUNDERLICH-MALEC ENGINEERING SYSTEMS, INC., Minnetonka, MN (US)

(*) Notice: Subject to any disclaimer, the term of this patent is extended or adjusted under 35 U.S.C. 154(b) by 471 days.

(21) Appl. No.: 16/502,353

(22) Filed: Jul. 3, 2019

Related U.S. Application Data

(63) Continuation of application No. 15/233,533, filed on Aug. 10, 2016, now Pat. No. 10,348,065.

(Continued)

(51) Int. Cl.
| | | |
|---|---|---|
| *H02B 1/30* | (2006.01) | |
| *H02B 1/38* | (2006.01) | |
| *H02G 15/06* | (2006.01) | |
| *G01R 27/16* | (2006.01) | |
| *G01R 31/28* | (2006.01) | |
| *G01R 31/12* | (2020.01) | |
| *G01R 31/327* | (2006.01) | |

(52) U.S. Cl.
CPC ............... *H02B 1/305* (2013.01); *H02B 1/38* (2013.01); *H02G 15/06* (2013.01); *G01R 27/16* (2013.01); *G01R 31/1272* (2013.01); *G01R 31/2808* (2013.01); *G01R 31/3271* (2013.01); *Y10T 29/49004* (2015.01)

(58) Field of Classification Search
CPC ............ G01R 27/16; G01R 31/3271; G01R 31/1272; G01R 31/2808; H02B 1/305; H02B 1/38; H02G 15/06
See application file for complete search history.

(56) References Cited

U.S. PATENT DOCUMENTS 3,855,503 A * 12/1974 Ristuccia ............... H02H 7/04
361/37
4,419,619 A * 12/1983 Jindrick ............ H02M 3/33515
323/257

(Continued)

FOREIGN PATENT DOCUMENTS

CN          203352018 U  * 12/2013
JP          2013243867 A * 12/2013

*Primary Examiner* — Jeffrey T Carley
(74) *Attorney, Agent, or Firm* — Angela Holt; Bradley Arant Boult Cummings LLP

(57) ABSTRACT

A method of connecting electrical substation wiring in an electrical substation provides pre-bundled yard cables configured to connect between field devices in the substation and a yard interface connection cabinet. The yard interface connection cabinet has an outside plug bulkhead plate that is accessible from outside of a control house that houses the yard interface connection cabinet. The outside plug bulkhead plate has a plurality of connectors configured to mate with the yard cables. The yard interface connection cabinet further has internal wires extending from an inside plug bulkhead plate and terminating at a terminal block. The connections and wires in the yard interface connection cabinet are tested with the yard cables before installation of the yard interface connection cabinet and yard cables in the substation. The yard cables are connected between the field devices and the outside plug bulkhead plate from outside of the control house.

9 Claims, 7 Drawing Sheets

Related U.S. Application Data

(60) Provisional application No. 62/202,985, filed on Aug. 10, 2015.

(56) References Cited

U.S. PATENT DOCUMENTS

| | | | | |
|---|---|---|---|---|
| 5,648,888 | A * | 7/1997 | Le Francois | H02B 7/00 307/147 |
| 6,424,060 | B1 * | 7/2002 | Shiely | H01H 9/26 307/328 |
| 6,696,925 | B1 * | 2/2004 | Aiello, Jr. | H01F 27/002 340/12.38 |
| 6,770,810 | B2 * | 8/2004 | Wiebe | H01F 27/04 174/50 |
| 2006/0269207 | A1 * | 11/2006 | Ivancevic | H04Q 1/06 385/135 |
| 2008/0074288 | A1 * | 3/2008 | Schnackenberg | G08G 1/095 340/907 |
| 2013/0346031 | A1 * | 12/2013 | Shaw | H02J 13/00034 703/1 |

\* cited by examiner

ELECTRICAL SUBSTATION YARD WIRING

REFERENCE TO RELATED APPLICATIONS

This application is a continuation of and claims priority to U.S. patent application Ser. No. 15/233,533, filed on Aug. 10, 2016 and titled "Method for Installation of Electrical Substation Yard Wiring," which claims priority to Provisional Patent Application U.S. Ser. No. 62/202,985, entitled "System and Method for Installing Electric Substation Yard Wiring" and filed on Aug. 10, 2015. Both prior applications are fully incorporated herein by reference.

BACKGROUND AND SUMMARY

Connecting yard wiring to intra-cabinet control house wiring in an electrical substation has historically been a labor-intensive task. Typically yard cables are run either overhead or in underground ducts and are brought up into a substation, into a control house, into individual cabinets, and then terminated cable by cable, wire by wire, at components within the control house. Each of the cables and wires must be carefully identified, labeled and tested in the field. Connection and testing of each wire can take several hours of technician time per wire, and such a labor-intensive installation increases the likelihood of errors in the field.

A system according the present disclosure saves installation and testing time by providing a pre-integrated yard interface connector (YIC) cabinet that has a plug bulkhead plate accessible from outside of a control house that houses the cabinet. The plug bulkhead plate has a plurality of connectors that mate with connectors on yard cables that have been pre-bundled for connection between field devices (such as transformers, breakers, switchgears, and the like) and the plug bulkhead plate. Instead of running individual wires from terminal blocks at the field devices, technicians connect the pre-bundled yard cables between connectors at the field device and the plug bulkhead plate in the YIC cabinet. The YIC cabinet comprises outside doors that open to reveal the plug bulkhead plate and to provide access for technicians to connect the yard cables. Internal wires extend from the back side of the plug bulkhead plate and terminate at a terminal block within the cabinet.

DETAILED DESCRIPTION

Figure 1:
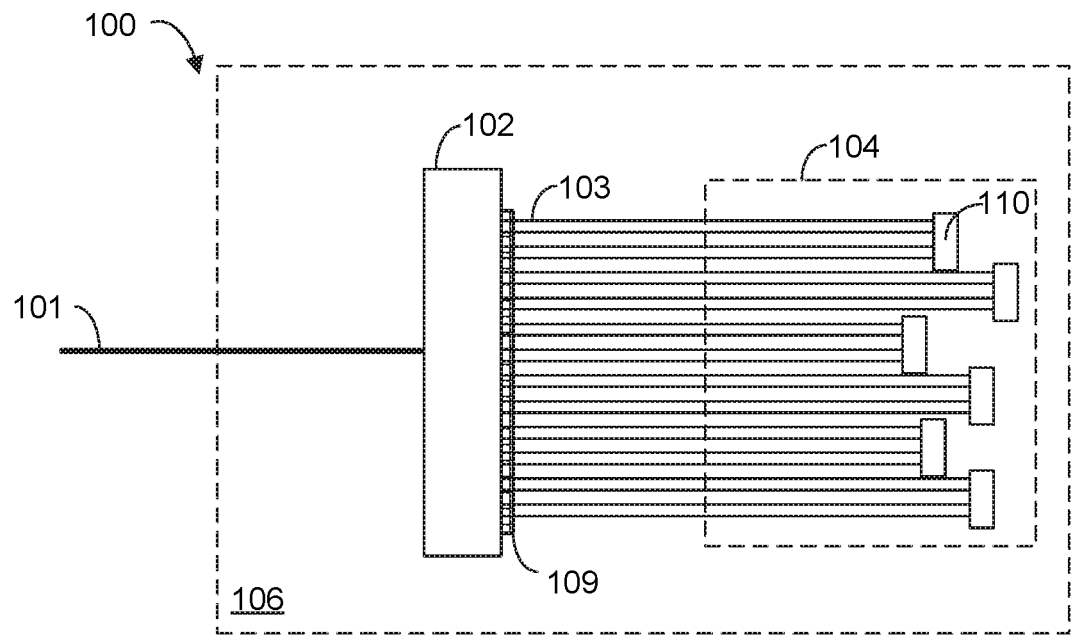
FIG. 1 depicts prior art electrical substation wiring.

FIG. 1 depicts prior art electrical substation wiring 100. Incoming power lines 101 terminate at field devices 102. Field devices 102 may be transformers, breakers, switchgears, and the like. From the field devices 102, hundreds of individual wires 103 must be connected to components with a control house 104 via hundreds of individual connections. The wires 103 are individually run, generally in underground ducts, from the field devices 102 into the control house 104, and connected to components 110 (e.g., relays circuit breakers, and the like) within the control house 104. Each of the wires 103 must be carefully identified and labeled. Each individual connection can take several hours of technician time, and such a labor-intensive installation increases the likelihood of errors in the field.

Figure 2:
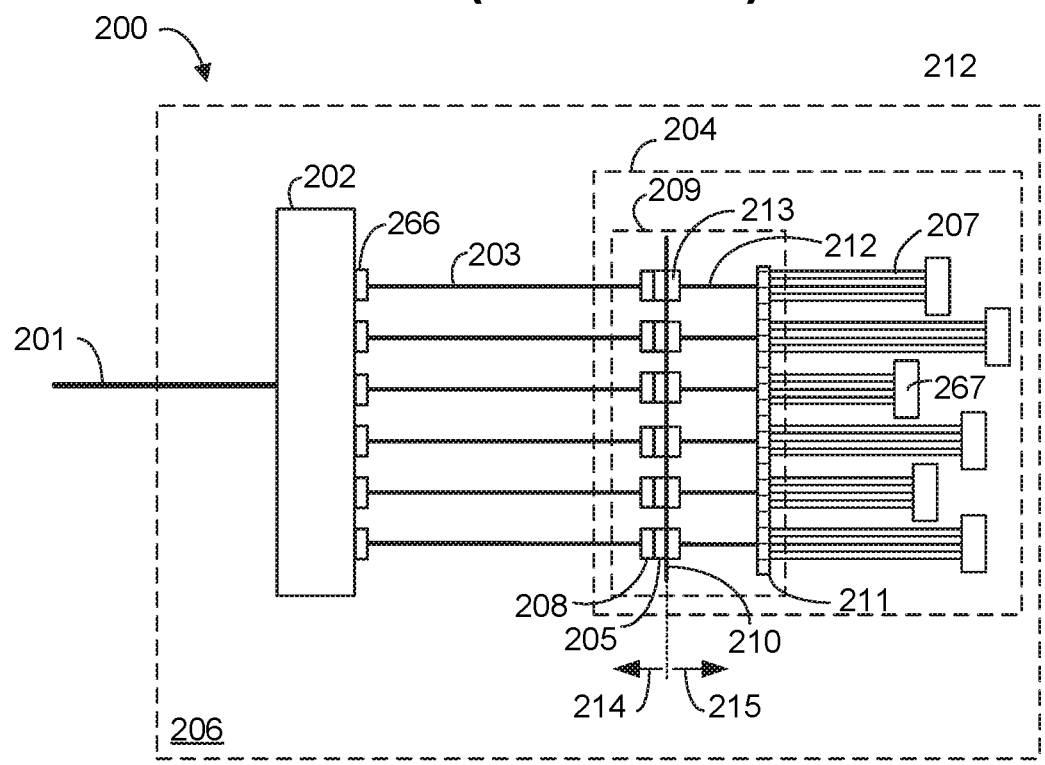
FIG. 2 depicts a wiring system for an electrical substation according to an exemplary embodiment of the present disclosure.

FIG. 2 depicts a wiring system 200 for an electrical substation 206 according to an exemplary embodiment of the present disclosure. Incoming power lines 201 terminate at field devices 202 as in the prior art system 100 (FIG. 1). In this system 200, instead of individual wires being connected one-by-one to components 110 in the control house 104 as shown in FIG. 1, yard cables 203 from the field devices 202 are formed by bundling together multiple wires in pre-integrated cables for connection from field devices 202 to a yard interface connection (YIC) cabinet 209 within the control house 204. A cable connector 208 mates with a panel connector 205 that has been pre-integrated on a plug bulkhead plate 210 on the yard side or outside 214 of the YIC cabinet 209. On an inside 215 of the YIC cabinet 209, YIC internal wires 212 extend between internal bulkhead connectors 213 (which are the back side of the panel connectors 205) and terminal blocks 211 within the YIC cabinet. Wires 207 extend from the terminal blocks 211 in the YIC cabinet to components 267 in the control house 204.

The wires within the yard cables 203 and the YIC internal wiring comprise a range of sizes and types of the kind known in substation wiring. At least some of the wires in the yard cables and YIC internal wiring comprises up to 1/0 American Wire Gauge (AWG, also known as Brown and Sharpe wire gauge) wires. Further, some of the wires may comprise direct current (dc) power wires, control wiring, Ethernet, fiber optic cable and the like.

The YIC cabinet 209 is pre-integrated with the YIC internal wires 212 pre-installed before the YIC cabinet 209 is delivered to a substation yard. Similarly, the yard cables 203 are pre-integrated, with device-side ends of the cables populated with plugs 266 required for connection to the field devices 202. The wiring within the YIC cabinet 209 is pre-tested with the yard cables 203 before delivery of the yard cables 203 and YIC cabinet 209 to the yard.

Further, the YIC cabinet 209 is integrated into the control house 204 at the factory. In this regard, wires 207 between the components 267 within the control house 204 and the terminal blocks 211 in the back of the YIC cabinet are connected and tested. After the control house 204 with YIC cabinet 209 and yard cables 203 are delivered to the field, the technician in the field simply has to connect the yard cables 203 between the field devices 202 and the plug bulkhead plate 210 on the YIC cabinet 209, on the outside of the YIC cabinet 209. The pre-integrated control house 204, YIC cabinet 209 and yard cables 203 eliminate the need to run individual wires 103 (FIG. 1) to control house components 267 (FIG. 1) within the control house 104 (FIG. 1) on a wire-by-wire basis, and then test every wire.

Figure 3:
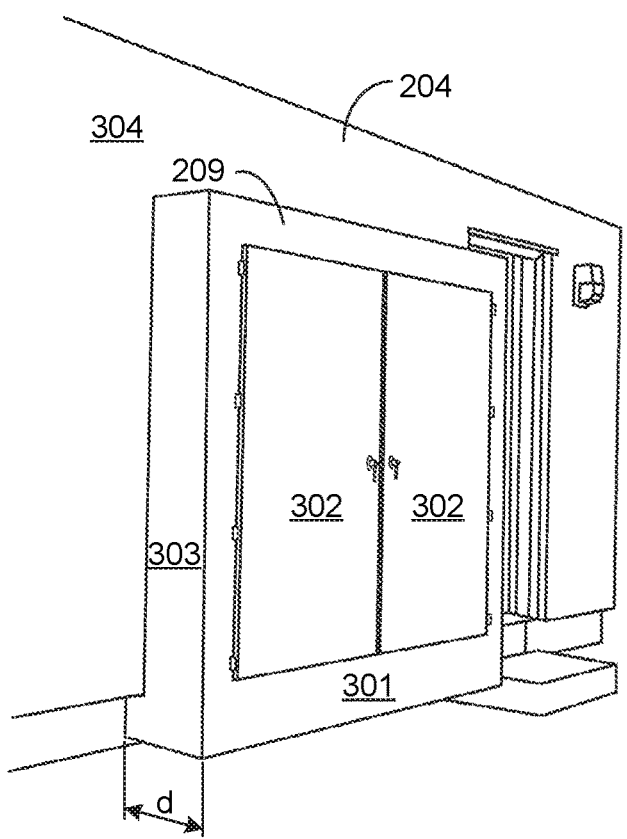
FIG. 3 is a perspective view of a YIC cabinet according to an exemplary embodiment of the present disclosure.

FIG. 3 is a perspective view of a YIC cabinet 209 according to an embodiment of the present disclosure. The YIC cabinet 209 is installed in an outside wall 304 of a control house 204. The YIC Cabinet is formed from stainless steel panels in the illustrated embodiment, though any suitably weather-resistant material and construction could be used without departing from the scope of the present disclosure. The YIC cabinet 209 comprises a front cabinet wall 301, opposed side walls 303 (only one of which is shown in FIG. 3), and a top panel (not shown). The YIC cabinet 209 extends from the control house 204 a distance "d," which distance is about eighteen (18) inches in one embodiment. The YIC cabinet 209 extends from the control house to accommodate the yard cables (not shown), as further discussed herein.

The YIC cabinet 209 comprises doors 302 which swing open outwardly in the illustrated embodiment to allow a user (not shown) access to the yard cables (not shown) and plug bulkhead plate (not shown). In the illustrated embodiment, the YIC cabinet 209 has two (2) doors, though other embodiments may have more or fewer doors in the YIC cabinet. Further, although the illustrated embodiment depicts swing-out doors 302, other means of accessing the yard cables and plug bulkhead plate may be used in other embodiments.

Figure 4:
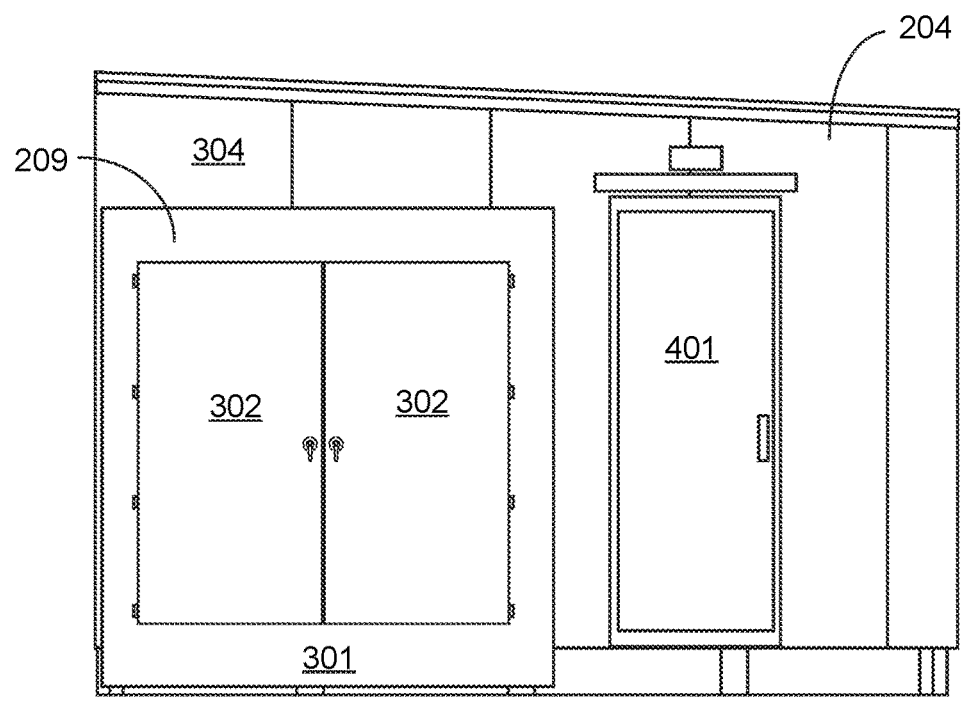
FIG. 4 is a partial front plan view of a YIC cabinet installed in a control house.

FIG. 4 is a partial front plan view of a YIC cabinet 209 installed in a control house 204. The control house 204 may be built using known methods to construct a weather-resistant enclosure. A door 401 allows entry by users (not shown) into the control house. As discussed above, the YIC cabinet 209 comprises doors 302 that allow users to access the yard cables (not shown) and the plug bulkhead plate (not shown), for connection/disconnection of the yard cables to and from the plug bulkhead plate.

Figure 5:
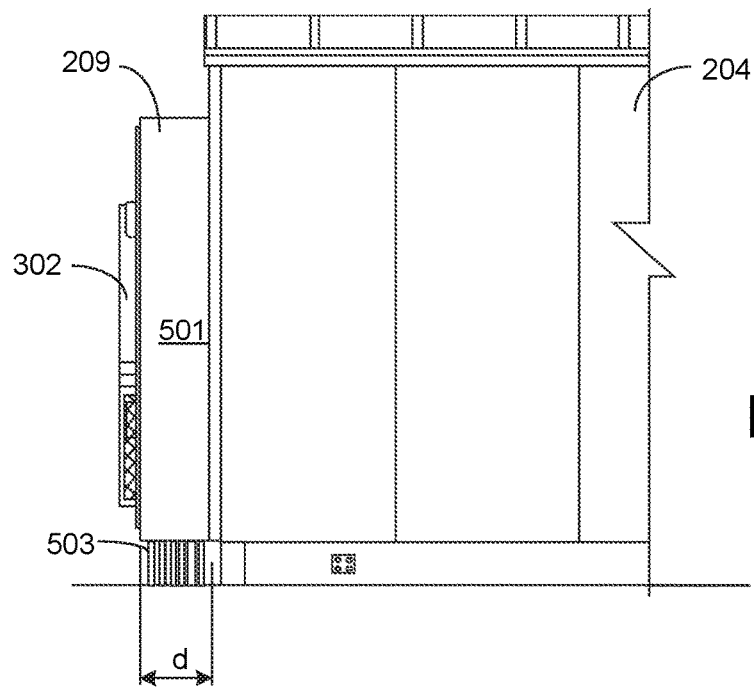
FIG. 5 is a side plan view of the YIC cabinet of FIG. 4.

FIG. 5 is a side plan view of the YIC cabinet 209 of FIG. 4. The YIC cabinet 209 is installed in the control house 204 such that an exposed portion 501 of the YIC cabinet 209 extends from the control house 204 a distance "d." In one embodiment, the distance "d" is approximately 18 inches. The distance "d" is substantially the same distance as the depth of the YIC cabinet 209 between the plug bulkhead plate and the outermost wall of the YIC cabinet in one embodiment. The extension of the YIC cabinet 209 outwardly from the control house 204 allows for yard cables 503 to be fed up from underground conduit (not shown) into the YIC cabinet and connected as discussed herein.

Figure 6:
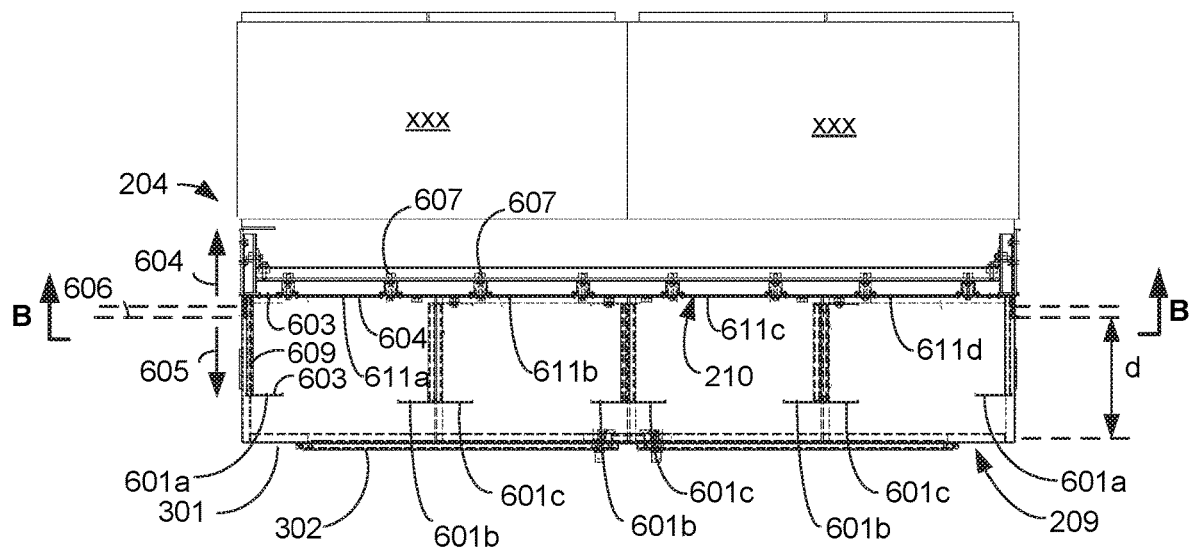
FIG. 6 is a cross sectional view of the YIC cabinet of FIG. 4, taken along section lines "A-A" of FIG. 4.

FIG. 6 is a cross sectional view of the YIC cabinet 209 of FIG. 4, taken along section lines "A-A" of FIG. 4. The outside wall of the control house 204 (FIG. 5) is represented by dashed line 606 in FIG. 6, and region 605 is outside of the control house and region 604 is inside of the control house. The YIC cabinet 209 is shown in FIG. 6 before yard cables (not shown) have been connected in the YIC cabinet 209.

The front cabinet wall 301 of the YIC cabinet 209 extends from the wall 606 of the control house 204 a distance "d" as discussed above. Opposed cabinet walls 303 flank the front cabinet wall 301, and are generally perpendicular to the front cabinet wall 301. Within the YIC cabinet 209, a plug bulkhead plate 210, which is generally parallel to the front cabinet wall 301, comprises the panel connectors 205 (FIG. 2) that have been pre-installed on the plug bulkhead plate 210 (but which are not shown in FIG. 6).

In the illustrated embodiment, a plurality of vertical cable trays 601 extend outwardly from the plug bulkhead plate 210. Cable trays 601a are disposed at opposed sides of the YIC cabinet 209 and comprise a ladder tray with a ladder cable support portion 603 extending between opposed flanges 609. Other means of supporting the cables are used in other embodiments. In the illustrated embodiment, the ladder cable support portion 603 extends outwardly about twelve (12) inches from the plug bulkhead plate 210, and the flanges 609 extend about four (4) inches from the ladder cable support portion 603, generally perpendicularly from the ladder cable support portion 603.

Cable trays 601b and 601c each comprise substantially similar ladder cable trays as the trays 601a, but the cable trays 601b and 601c are attached to one another back-to-back, such that yard cables (not shown) can be supported on both sides of the cable trays 601b and 601c. In the illustrated embodiment, there are two cable trays 601a and three back-to-back pairs of 601b/601c. Other embodiments may comprise a different number and/or configuration of cable trays.

In the illustrated embodiment, the plug bulkhead plate 210 of the YIC cabinet 209 comprises four (4) bulkhead columns 611a, 611b, 611c, and 611d, each column 611a, 611b, 611c, and 611d comprising one or more individual plug plates (not shown), as further discussed herein. Other embodiments may comprise more or fewer bulkhead columns. A plurality of struts 607 provide structural support for the plug bulkhead plate 210 and the individual plug plates (not shown) that comprise the bulkhead columns 611a, 611b, 611c, and 611d.

Figure 7:
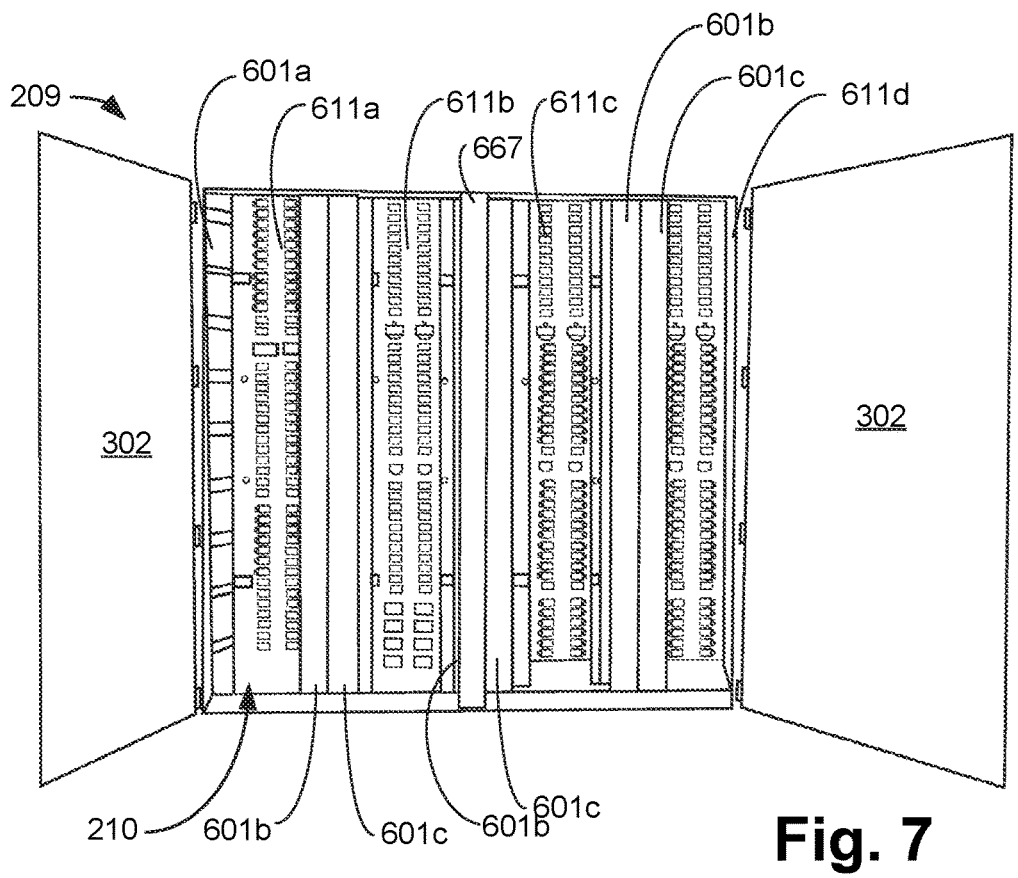
FIG. 7 is a front perspective view of the YIC cabinet with the doors open to reveal the plug bulkhead plate.

FIG. 7 is a front perspective view of the YIC cabinet 209 with the doors 302 open to reveal the plug bulkhead plate 210. In the illustrated embodiment, the bulkhead columns 611a, 611b, 611c, and 611d are spaced apart from one another with cable tray pairs 601b/601c between adjacent columns. Center door support 667 is generally in the same plane as the front cabinet wall 301 (FIG. 3), and doors 302 close and latch against the center door support 667.

Figure 8:
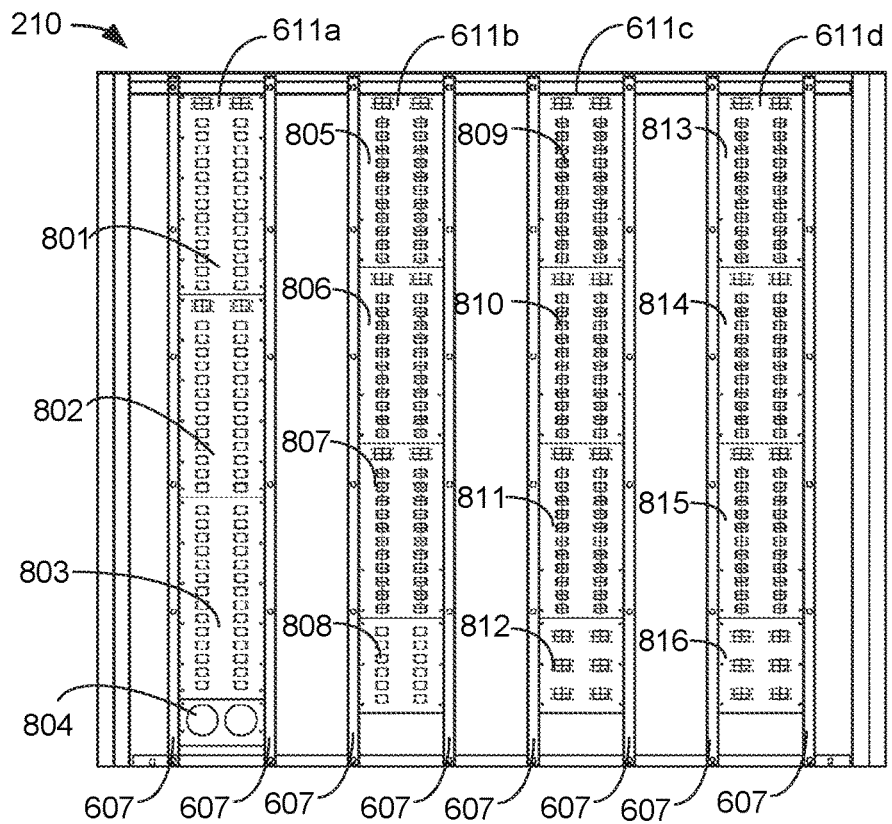
FIG. 8 is a cross-sectional view of the YIC cabinet of FIG. 6, taken along section lines "B-B" of FIG. 6.

FIG. 8 is a cross-sectional view of the YIC cabinet 209 of FIG. 6, taken along section lines "B-B" of FIG. 6. The bulkhead columns 611a, 611b, 611c, and 611d each comprise a plurality of plug plates. For example, column 611a comprises plug plates 801, 802, 803 and 804; column 611b comprises plug plates 805, 806, 807, and 808; column 611c comprises plug plates 809, 810, 811, and 812; and column 611d comprises plug plates 813, 814, 815, and 816. The plug plates 801-816 extend between and are affixed to the struts 607 in the illustrated embodiment. The plug plates 801-816 are pre-machined plates, formed from stainless steel or other non-corrosive material in the illustrated embodiment, with a plurality of openings configured to receive cable connectors (not shown) as further discussed herein. Some of the plug plates 801-816 are substantially similar to one another, and others can be different. In this regard, the plug plates 801-816 are machined and populated to receive the cable connectors for mating to the yard cables (not shown), and the number and type of plug plates and openings in the plug plates are customized in the manufacturing stage for each particular user's yard cable connections.

Figure 9:
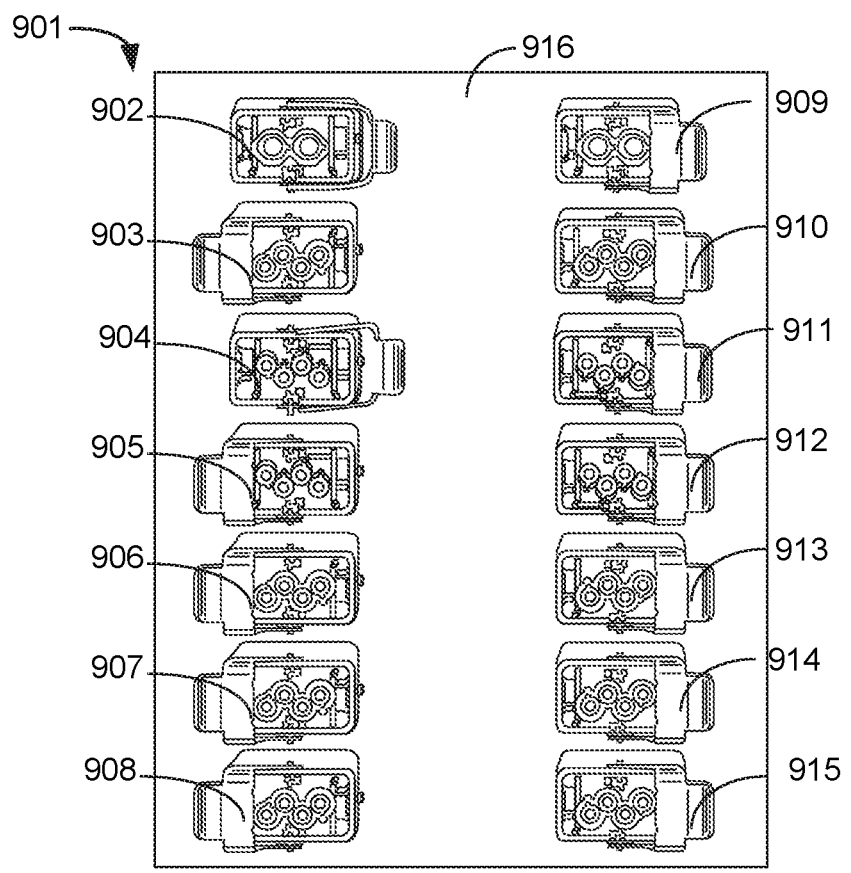
FIG. 9 depicts an enlarged view of an exemplary individual plug plate according to the present disclosure.

FIG. 9 depicts an enlarged view of an exemplary individual plug plate 901 according to the present disclosure. The individual plug plate 901 comprises a stainless steel plate 916 and connectors 902-915 installed on the plate. The connectors 902-915 comprise female Harting brand cable connectors in the illustrated embodiment. Other connectors are used in other embodiments. Yard cables (not shown) mate with the connectors 902-915 as further discussed herein.

Figure 10:
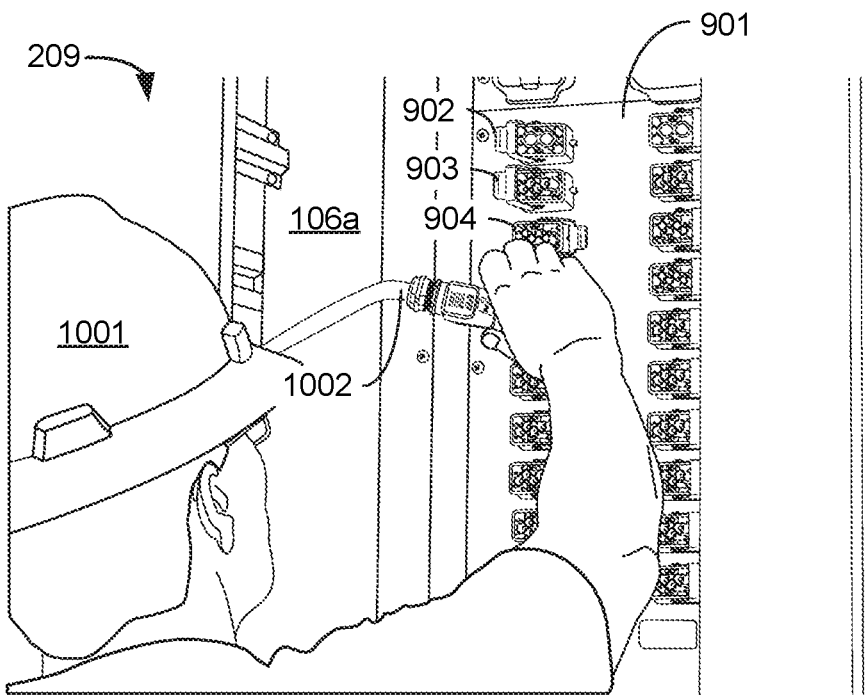
FIG. 10 depicts a technician connecting a yard cable to a connector on the plug plate of FIG. 9.

FIG. 10 depicts a technician 1001 connecting a yard cable 1002 to a connector on the plug plate 901 of FIG. 9. The cable 1002 is typically run in underground conduit (not shown) from the field devices (not shown) and into the YIC cabinet 209 from beneath the cabinet 209, along the cable tray 601*a*, and plugged into connector 905 (FIG. 9) on the plug plate 901. The yard cable 1001 is secured to the cable tray 601*a* to keep the cable 1002 in place and out of the way of other connections to the plate 901.

Figure 11:
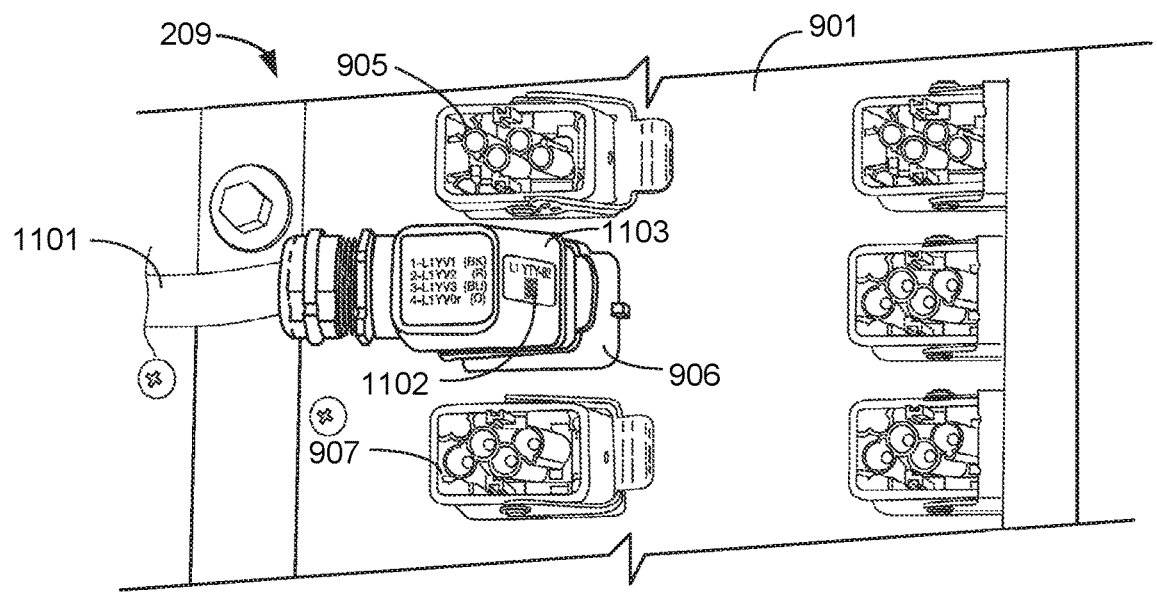
FIG. 11 is an enlarged partial view of the plug plate of FIG. 10, after connection of a yard cable to a connector.

FIG. 11 is an enlarged view of the plug plate 901 of FIG. 10, after connection of a yard cable 1101 to the connector 906. In this regard, the yard cable 1101 comprises a male connector 1103 that mates with the female connector 906 that has been preinstalled on the plug plate 901. The male connector 1103 comprises a label 1102 permanently attached to the connector, the label comprising a two-dimensional (2D) matrix code used to identify the cable 1002 electronically by scanning with a handheld computing device. The 2D code can comprise a Quick Response (QR) code, an Aztec code, a high capacity color barcode (HCCB) code, or some other 2D matrix code. U.S. Pat. No. 8,936,194, titled "Methods and systems for using two-dimensional matrix codes associated with panel component and equipment information and quality control," and U.S. Pat. No. 9,047,279, titled "Methods and systems for using two-dimensional matrix codes associated with panel component and equipment information and quality control," both owned by the Applicant, discuss the 2D code and its use to identify cables in substation yard wiring. Both U.S. Pat. Nos. 8,936,194 and 9,047,279 are incorporated herein by reference in their entireties.

Figure 12:
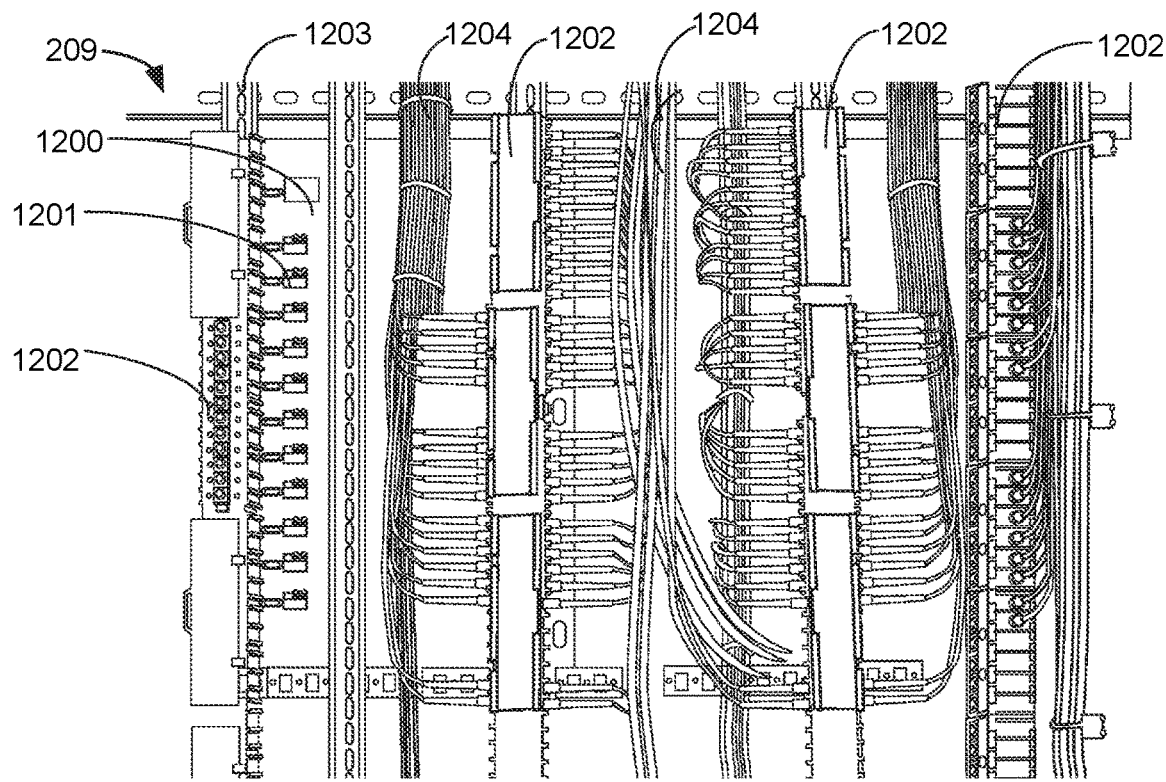
FIG. 12 depicts the inside or back side of the YIC cabinet, viewed from within the control house.

FIG. 12 depicts the inside or back side of the YIC cabinet 209, viewed from within the control house 204 (FIG. 4). Connectors 1201 shown on the back side 1200 of the plug bulkhead plate 210 (FIG. 9) are the back side of the connectors illustrated in FIGS. 9-11. Intra-cabinet wire bundles 1204 are run between the connectors 1201 and a plurality of terminal blocks 1202. In this regard, the wire bundles 1204 connect at a first end to the connectors 1201 on the back side 1200 of the plug bulkhead plate 210 and then individual wires 1203 are connected to terminals on the terminal blocks 1202.

When a YIC cabinet 209 is delivered to a customer, the intra-cabinet cables 1204 have already been integrated in the cabinet 209 (i.e., connected between the back side 1200 of the plug bulkhead plate 210 and the terminal blocks 1202). Technicians in the field then connect components in the control house (not shown) to the terminal blocks 1202.

Figure 13:
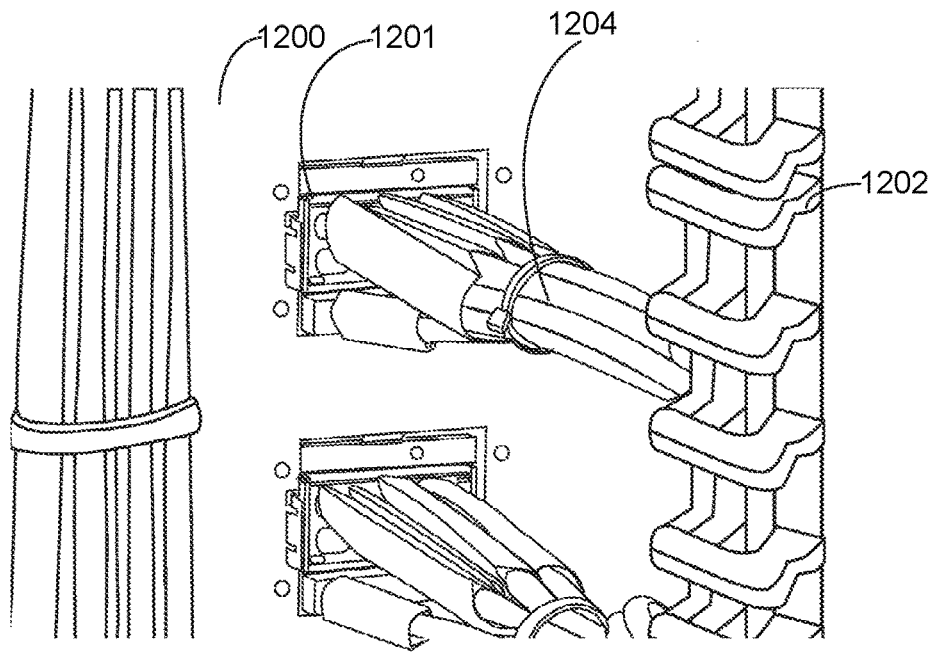
FIG. 13 is an enlarged view of the back side of the plug bulkhead plate of FIG. 12.

FIG. 13 is an enlarged view of the back side 1200 of the plug bulkhead plate 210 (FIG. 9), showing wire bundles 1204 connecting at a first end to the connectors 1201 on the back side 1200 of the plug bulkhead plate 210 and at a second end to the terminal block 1202.

Figure 14:
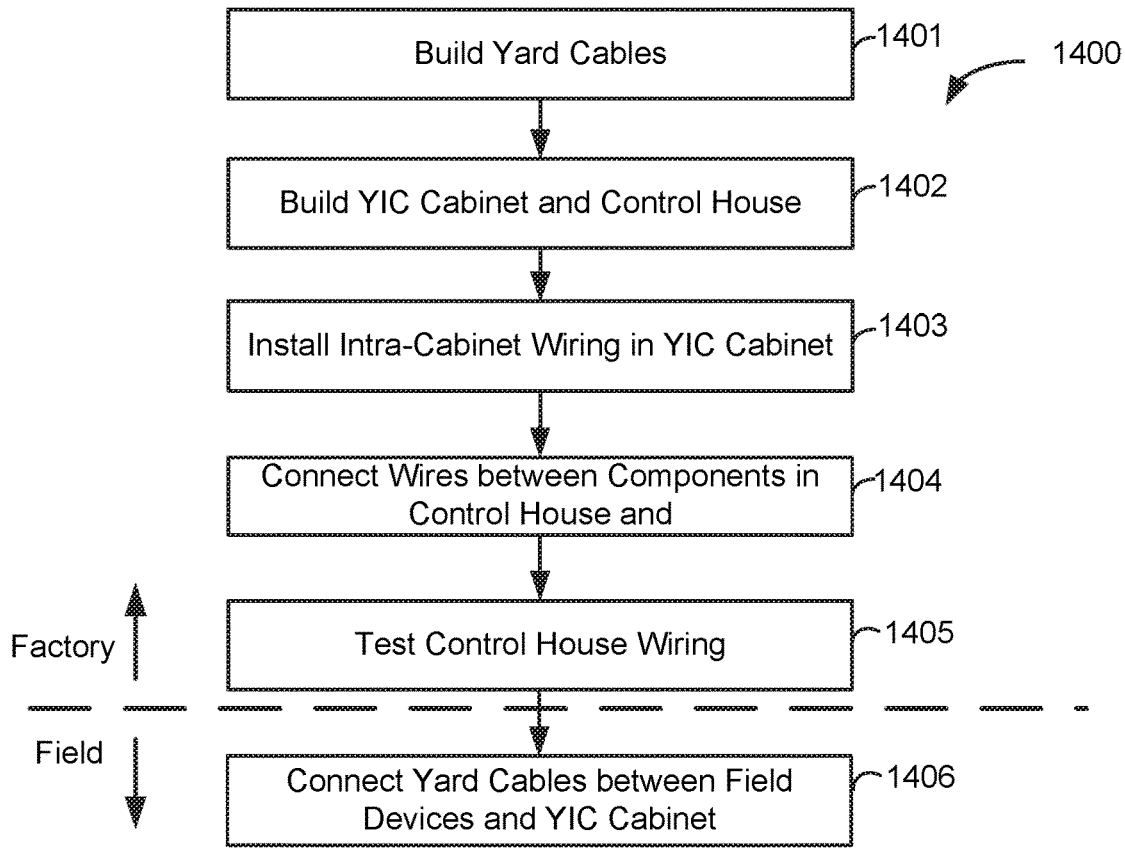
FIG. 14 depicts a method of installing electrical substation yard cabling according to an exemplary embodiment of the present disclosure.

FIG. 14 depicts a method 1400 of installing electrical substation yard cabling according to an exemplary embodiment of the present disclosure. In step 1401 of the method 1400, yard cables 203 (FIG. 2) are built at the factory with wires and connectors according to specification provided by the customer. A first end 266 (FIG. 2) of each yard cable 203 is configured to connect to field devices 202 (FIG. 2) in the substation. A second end (cable connector 208 (FIG. 2)) of each yard cable 203 is configured to connect to the plug bulkhead plate 210 (FIG. 2) of the YIC interface cabinet 209 (FIG. 2).

In step 1402 of the method 1400, the YIC cabinet 209 (FIG. 2) is built at the factory or supplied from other locations. The panel connectors 205 (FIG. 2) which are mated to the panel connectors 208 on the second end of the yard cables 203 are installed on the plug bulkhead plate 210 of the YIC interface cabinet.

In step 1403 of the method 1400, YIC internal wires 212 (FIG. 2) are installed in the YIC cabinet 209. In this regard, wire bundles are run between the internal bulkhead connectors 213 (FIG. 2) on the back side of the plug bulkhead plate 210 to individual terminals on terminal blocks 211.

In step 1404 of the method, wires 207 (FIG. 2) are run between the terminal blocks 211 in the YIC cabinet 209 to components 267 in the control house 204.

In step 1405 of the method, the yard cables 203, YIC cabinet 209, and the wires 207 within the control house 204 are tested to ensure that every wire is properly connected. The yard cables 203 and the control house 204 with the YIC cabinet 209 installed are then delivered to the field.

In step 1406, the yard cables 203 (FIG. 2) are connected by a field technician between field devices 202 (FIG. 2) and the YIC cabinet.

What is claimed is:

1. A method of connecting electrical substation wiring in an electrical substation, the method comprising:
    providing pre-bundled yard cables, the yard cables comprising a first end and a second end, the first end of the yard cables configured to connect to field devices in the substation;
    installing a yard interface connection cabinet by connecting the yard interface connection cabinet on an exterior wall of a control house, the yard interface connection cabinet comprising an outside plug bulkhead plate, the outside plug bulkhead plate being accessible by a technician by opening exterior doors of the yard interface connection cabinet from a yard side of the control house, without the technician needing to enter the control house, the outside plug bulkhead plate comprising a plurality of connectors, the connectors configured to mate with the yard cables at the second end of the yard cables, the yard interface connection cabinet further comprising internal wires extending from an inside plug bulkhead plate of the yard interface connection cabinet and terminating at a terminal block of the yard interface connection cabinet; subsequently installing the control house in the substation;
    opening the exterior doors of the yard interface connection cabinet from the yard side of the control house while the technician remains outside of the control house; and
    connecting the second end of the yard cables to the connectors of the outside plug bulkhead plate from the yard side of the control house, while the technician remains outside of the control house.

2. The method of claim 1, further comprising testing the connections and wires in the yard interface connection cabinet with the yard cables before installation of the yard interface connection cabinet and yard cables in the substation.

3. The method of claim 1, further comprising connecting individual wires from the terminal block to components within the control house.

4. The method of claim 1, wherein at least some of the yard cables comprise 1/0 American Wire Gauge wire.

5. The method of claim 1, further comprising running the yard cables underground for at least a portion of a distance between the field devices and the yard interface connection cabinet such that the yard cables approach the yard interface connection cabinet from beneath the yard interface connection cabinet.

6. The method of claim 5, further comprising positioning the yard interface connection cabinet such that it extends from the control house a distance "d" to accommodate the yard interface connection cabinet receiving yard cables from beneath the yard interface connection cabinet, wherein the distance "d" is at least a distance between an outside plug bulkhead plate of the yard interface connection cabinet and a front wall of the yard interface connection cabinet, and the distance "d" is greater than zero.

7. The method of claim 6, wherein the distance "d" is at least 18 inches.

8. The method of claim 6, wherein the distance "d" is between 12 inches and 18 inches.

9. The method of claim 6, wherein the distance "d" is between six inches and 12 inches.

\* \* \* \* \*